United States Patent
Zhou et al.

(10) Patent No.: US 10,283,030 B2
(45) Date of Patent: May 7, 2019

(54) SHIFT REGISTER, GATE DRIVER, DISPLAY PANEL AND DRIVING METHOD

(71) Applicants: BOE Technology Group Co., Ltd., Beijing (CN); Hefei Xinsheng Optoelectronics Technology Co., Ltd., Hefei (CN)

(72) Inventors: Maoxiu Zhou, Beijing (CN); Xiaoye Ma, Beijing (CN); Peng Jiang, Beijing (CN); Haipeng Yang, Beijing (CN); Ke Dai, Beijing (CN); Yong Jun Yoon, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/568,636

(22) PCT Filed: May 17, 2017

(86) PCT No.: PCT/CN2017/084692
§ 371 (c)(1),
(2) Date: Oct. 23, 2017

(87) PCT Pub. No.: WO2018/076665
PCT Pub. Date: May 3, 2018

(65) Prior Publication Data
US 2018/0301075 A1    Oct. 18, 2018

(30) Foreign Application Priority Data
Oct. 31, 2016    (CN) .......................... 2016 1 0928535

(51) Int. Cl.
*G09G 3/20*    (2006.01)
*G11C 19/28*    (2006.01)

(52) U.S. Cl.
CPC ............... *G09G 3/20* (2013.01); *G11C 19/28* (2013.01); *G09G 2310/0267* (2013.01);
(Continued)

(58) Field of Classification Search
None
See application file for complete search history.

(56) References Cited

U.S. PATENT DOCUMENTS

2014/0192039 A1    7/2014  Wang et al.
2015/0109353 A1*   4/2015  Yu .......................... G11C 19/28
                                                    345/691

(Continued)

FOREIGN PATENT DOCUMENTS

CN    102682727 A    9/2012
CN    103714792 A    4/2014

(Continued)

OTHER PUBLICATIONS

Aug. 16, 2017—(WO) International Search Report and Written Opinion application PCT/CN2017/084692 with English Translation.
Dec. 4, 2017—(CN) First Office Action Appn 201610928535.4 with English Tran.

(Continued)

Primary Examiner — Joseph R Haley (57) ABSTRACT

A shift register, a gate driver, a display panel and a driving method are provided. The shift register includes an input-reset circuit, which is connected with a pull-up node; and a driving circuit, which is connected with the pull-up node. The input-reset circuit is configured to: write a voltage of a first signal into the pull-up node in response to a second signal, in an input phase of forward scanning; write a voltage of a fourth signal into the pull-up node in response to a third signal, in a reset phase of forward scanning; write the voltage of the fourth signal into the pull-up node in response to the third signal, in an input phase of reverse scanning; and (Continued)

write the voltage of the first signal into the pull-up node in response to the second signal, in a reset phase of reverse scanning.

18 Claims, 9 Drawing Sheets

(52) U.S. Cl.
CPC ............... *G09G 2310/0283* (2013.01); *G09G 2310/0286* (2013.01); *G09G 2310/061* (2013.01)

(56) References Cited

U.S. PATENT DOCUMENTS

| | | |
|---|---|---|
| 2016/0086562 A1 | 3/2016 | Tan et al. |
| 2017/0270851 A1 | 9/2017 | Shang et al. |

FOREIGN PATENT DOCUMENTS

| | | |
|---|---|---|
| CN | 104252853 A | 12/2014 |
| CN | 105185349 A | 12/2015 |
| CN | 105427830 A | 3/2016 |
| CN | 106448536 A | 2/2017 |
| CN | 206134207 U | 4/2017 |
| KR | 20140050304 A | 4/2014 |

OTHER PUBLICATIONS

Jun. 20, 2018—(CN) Second Office Action Appn 201610928535.4 with English Translation.

\* cited by examiner

FIG. 14 ized circuit (IC), so as to implement a narrow-frame of
SHIFT REGISTER, GATE DRIVER, DISPLAY PANEL AND DRIVING METHOD The application is a U.S. National Phase Entry of International Application No. PCT/CN2017/084692 filed on May 17, 2017, designating the United States of America and claiming priority to Chinese Patent Application No. 201610928535.4, filed Oct. 31, 2016. The present application claims priority to and the benefit of the above-identified applications and the above-identified applications are incorporated by reference herein in their entirety.

TECHNICAL FIELD

Embodiments of the present disclosure relate to a shift register, a gate driver, a display panel and a driving method.

BACKGROUND

With rapid development of a display technology, a display panel is increasingly developing toward a trend of high integration and low cost. A gate-driver on array (GOA) technology involves directly integrating a gate driver on an array substrate of a display device by a photolithography process, and a GOA circuit usually includes a plurality of cascaded shift registers, and each shift register corresponds to a row of gate lines, so as to implement performing scan driving for the display panel. The integration technology can save space for a bonding region and a fan-out region for an integrated circuit (IC), so as to implement a narrow-frame of the display panel, and at a same time, reduce a product cost and increase a product yield.

SUMMARY

An embodiment of the present disclosure provides a shift register, comprising: an input-reset circuit, connected with a pull-up node; and a driving circuit, connected with the pull-up node; the input-reset circuit is configured to: receive a first signal and a second signal and write a voltage of the first signal into the pull-up node in response to the second signal, in an input phase of forward scanning; receive a third signal and a fourth signal and write a voltage of the fourth signal into the pull-up node in response to the third signal, in a reset phase of forward scanning; receive the third signal and the fourth signal and write the voltage of the fourth signal into the pull-up node in response to the third signal, in an input phase of reverse scanning; and receive the first signal and the second signal and write the voltage of the first signal into the pull-up node in response to the second signal, in a reset phase of reverse scanning; and the driving circuit is configured to output a gate driving signal when a voltage of the pull-up node satisfies an output condition of the driving circuit.

For example, in the shift register of an embodiment of the present disclosure, the input-reset circuit includes a first transistor and a second transistor, a first electrode of the first transistor is connected with a first signal terminal to receive the first signal, a gate electrode of the first transistor is connected with a second signal terminal to receive the second signal, a second electrode of the first transistor is connected with the pull-up node; and a first electrode of the second transistor is connected with a fourth signal terminal to receive the fourth signal, a gate electrode of the second transistor is connected with a third signal terminal to receive the third signal, and a second electrode of the second transistor is connected with the pull-up node.

For example, in the shift register of an embodiment of the present disclosure, the driving circuit includes a storage circuit and an output circuit.

For example, in the shift register of an embodiment of the present disclosure, the storage circuit includes a storage capacitor, a first terminal of the storage capacitor is connected with the pull-up node, and a second terminal of the storage capacitor is connected with the output terminal; the output circuit includes a third transistor, a first electrode of the third transistor is connected with a first clock signal terminal to receive a first clock signal, a gate electrode of the third transistor is connected with the pull-up node, and a second electrode of the third transistor is connected with the output terminal; when the voltage of the pull-up node satisfies an output condition of the third transistor, the output terminal outputs the gate driving signal.

For example, in the shift register of an embodiment of the present disclosure, the driving circuit further includes an initialization circuit, which is configured to initialize the output terminal.

For example, in the shift register of an embodiment of the present disclosure, the initialization circuit includes a fourth transistor, a first electrode of the fourth transistor is connected with the output terminal, a gate electrode of the fourth transistor is connected with a second clock signal terminal to receive a second clock signal, and a second electrode of the fourth transistor is connected with a first voltage terminal to receive a first voltage.

For example, in the shift register of an embodiment of the present disclosure, the driving circuit further includes a noise reduction circuit, which is configured to perform noise reduction on the pull-up node and the output terminal.

For example, in the shift register of an embodiment of the present disclosure, the noise reduction circuit includes a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor and a sixteenth transistor; a first electrode of the fifth transistor is connected with a first control signal terminal to receive a first control signal, a gate electrode of the fifth transistor is connected with the first electrode of the fifth transistor, and a second electrode of the fifth transistor is connected with a first node; a first electrode of the sixth transistor is connected with the first electrode of the fifth transistor, a gate electrode of the sixth transistor is connected with the first node, and a second electrode of the sixth transistor is connected with a first pull-down node; a first electrode of the seventh transistor is connected with the first node, a gate electrode of the seventh transistor is connected with the pull-up node, and a second electrode of the seventh transistor is connected with a first voltage terminal; a first electrode of the eighth transistor is connected with the first pull-down node, a gate electrode of the eighth transistor is connected with the pull-up node, and a second electrode of the eighth transistor is connected with the first voltage terminal; a first electrode of the ninth transistor is connected with the pull-up node, a gate electrode of the ninth transistor is connected with a second pull-down node, and a second electrode of the ninth transistor is connected with the first voltage terminal; a first electrode of the tenth transistor is connected with the pull-up node, a gate electrode of the tenth transistor is connected with the first pull-down node, and a second electrode of the tenth transistor is connected with the first voltage terminal; a first electrode of the eleventh transistor is connected with a second control signal terminal to receive a second control signal, a gate electrode of the eleventh transistor is connected with the first electrode of the eleventh transistor, and a second electrode of the eleventh transistor is connected with a second node; a first electrode of the twelfth transistor is connected with the first electrode of the eleventh transistor, a gate electrode of the twelfth transistor is connected with the second node, and a second electrode of the twelfth transistor is connected with the second pull-down node; a first electrode of the thirteenth transistor is connected with the second node, a gate electrode of the thirteenth transistor is connected with the pull-up node, and a second electrode of the thirteenth transistor is connected with the first voltage terminal; a first electrode of the fourteenth transistor is connected with the second pull-down node, a gate electrode of the fourteenth transistor is connected with the pull-up node, and a second electrode of the fourteenth transistor is connected with the first voltage terminal; a first electrode of the fifteenth transistor is connected with the output terminal, a gate electrode of the fifteenth transistor is connected with the first pull-down node, and a second electrode of the fifteenth transistor is connected with the first voltage terminal; and a first electrode of the sixteenth transistor is connected with the output terminal, a gate electrode of the sixteenth transistor is connected with the second pull-down node, and a second electrode of the sixteenth transistor is connected with the first voltage terminal.

For example, in the shift register of an embodiment of the present disclosure, in the input phase of forward scanning, a voltage of the first signal is a high-level voltage, a voltage of the second signal is a high-level voltage, a voltage of the third signal is a low-level voltage, and a voltage of the fourth signal is a low-level voltage; in the reset phase of forward scanning, the voltage of the first signal is a low-level voltage, the voltage of the second signal is a low-level voltage, the voltage of the third signal is a high-level voltage, and the voltage of the fourth signal is a low-level voltage; in the input phase of reverse scanning, the voltage of the first signal is a low-level voltage, the voltage of the second signal is a low-level voltage, the voltage of the third signal is a high-level voltage, and the voltage of the fourth signal is a high-level voltage; and in the reset phase of reverse scanning, the voltage of the first signal is a low-level voltage, the voltage of the second signal is a high-level voltage, the voltage of the third signal is a low-level voltage, and the voltage of the fourth signal is a low-level voltage.

An embodiment of the present disclosure provides a gate driver comprising the shift register according to any one embodiment of the present disclosure.

For example, the gate driver of an embodiment of the present disclosure, comprising a plurality of cascaded shift registers each according to any one embodiment of the present disclosure; except a first-stage shift register and a last-stage shift register, the second signal of a present-stage shift register is an output signal output by an output terminal of a previous-stage shift register, and the third signal of the present-stage shift register is an output signal output by an output terminal of a next-stage shift register.

An embodiment of the present disclosure provides a display panel, comprising the gate driver according to any one embodiment of the present disclosure.

For example, the display panel of an embodiment of the present disclosure further comprises gate lines, data lines, and a plurality of pixel units defined by the gate lines and the data lines intersecting with each other; the gate driver is configured to provide gate driving signals to the gate lines.

An embodiment of the present disclosure provides a bidirectional scanning driving method of the gate driver according to any one embodiment of the present disclosure, comprising: receiving the first signal and the second signal and writing the voltage of the first signal into the pull-up node in response to the second signal, in the input phase of forward scanning; receiving the third signal and the fourth signal and writing the voltage of the fourth signal into the pull-up node in response to the third signal, in the reset phase of forward scanning; receiving the third signal and the fourth signal and writing the voltage of the fourth signal into the pull-up node in response to the third signal, in the input phase of reverse scanning; and receiving the first signal and the second signal and writing the voltage of the first signal into the pull-up node in response to the second signal, in the reset phase of reverse scanning.

For example, the method of an embodiment of the present disclosure further comprises outputting a gate driving signal, when the voltage of the pull-up node satisfies an output condition of a driving circuit.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Clear and complete description will be given below to the technical proposals of the embodiments of the present disclosure to provide more comprehensive description on the preferred embodiments of the present disclosure and a variety of characteristics and favorable details thereof, with reference to the accompanying drawings and non-limiting preferred embodiments shown in the accompanying drawings and described in detail in the following description. It should be noted that the characteristics shown in the figures are not drawn in scale. The present disclosure omits the description on the known materials, components and process techniques, thereby not obscuring the preferred embodiments of the present disclosure. The given examples are only intended to facilitate an understanding of the implementation of the preferred embodiments of the present disclosure, so that the preferred embodiments can be further implemented by those skilled in the art. Therefore, the examples should not be construed as the limitation of the scope of the embodiments of the present disclosure.

Unless otherwise specified, the technical terms or scientific terms used in the present disclosure shall have normal meanings understood by those skilled in the art. The words "first", "second" and the like used in the present disclosure do not indicate any sequence, number or importance and are only intended to distinguish different components. In addition, in the embodiments of the present disclosure, same or similar reference numerals indicate same or similar members.

A traditional shift register and a traditional gate driver can only perform unidirectional scanning, and a display panel has relatively poor compatibility.

A shift register, a gate driver, a display panel and a driving method provided by embodiments of the present disclosure can implement bidirectional scanning of the gate driver, and improve compatibility of the display panel.

Figure 1:
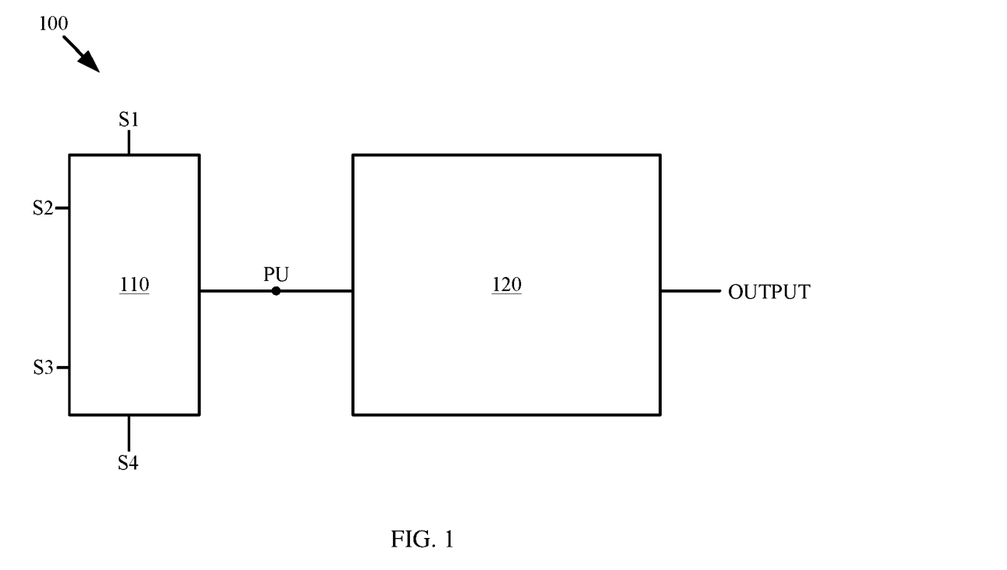
FIG. 1 is a first schematic diagram of a shift register provided by an embodiment of the present disclosure.

An embodiment of the present disclosure provides a shift register 100, and as illustrated in FIG. 1, the shift register 100 comprises: an input-reset circuit 110, connected with a pull-up node PU; and a driving circuit 120, connected with the pull-up node PU. The input-reset circuit 110 is configured to: receive a first signal S1 and a second signal S2 and write a voltage of the first signal S1 into the pull-up node PU in response to the second signal S2, in an input phase of forward scanning; receive a third signal S3 and a fourth signal S4 and write a voltage of the fourth signal S4 into the pull-up node PU in response to the third signal S3, in a reset phase of forward scanning; receive the third signal S3 and the fourth signal S4 and write the voltage of the fourth signal S4 into the pull-up node PU in response to the third signal S3, in an input phase of reverse scanning; and receive the first signal S1 and the second signal S2 and write the voltage of the first signal S1 into the pull-up node PU in response to the second signal S2, in a reset phase of reverse scanning. The driving circuit 120 is configured to output a gate driving signal, when a voltage of the pull-up node PU satisfies an output condition of the driving circuit 120.

For example, the gate driving signal is output by an output terminal OUTPUT.

Figure 2:
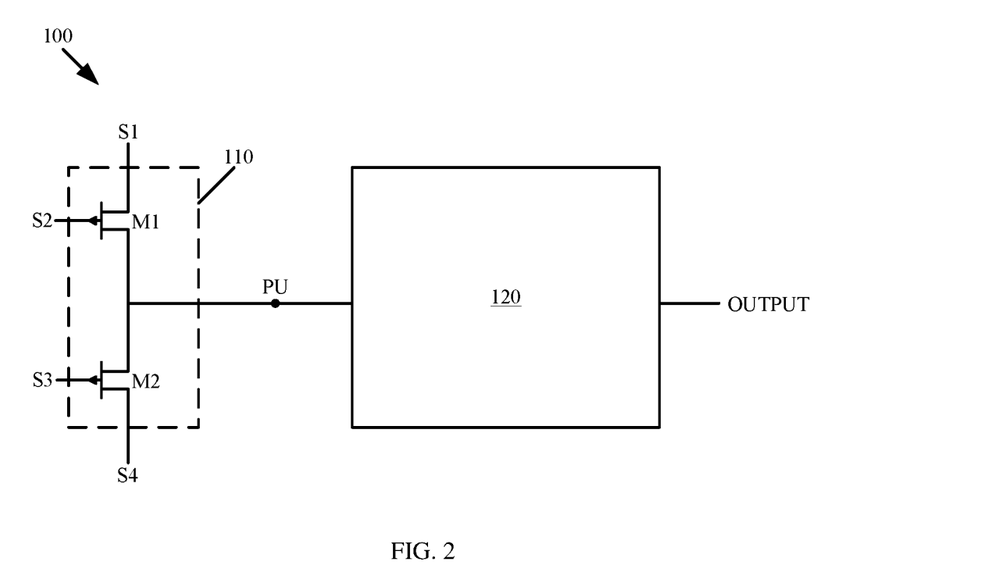
FIG. 2 is a second schematic diagram of the shift register provided by the embodiment of the present disclosure.

For example, as illustrated in FIG. 2, in the shift register 100 provided by the embodiment of the present disclosure, the input-reset circuit 110 includes a first transistor M1 and a second transistor M2. A first electrode of the first transistor M1 is connected with a first signal terminal to receive the first signal S1, a gate electrode of the first transistor M1 is connected with a second signal terminal to receive the second signal S2, and a second electrode of the first transistor M1 is connected with the pull-up node PU; a first electrode of the second transistor M2 is connected with a fourth signal terminal to receive the fourth signal S4, a gate electrode of the second transistor M2 is connected with a third signal terminal to receive the third signal S3, and a second electrode of the second transistor M2 is connected with the pull-up node PU.

Figure 3:
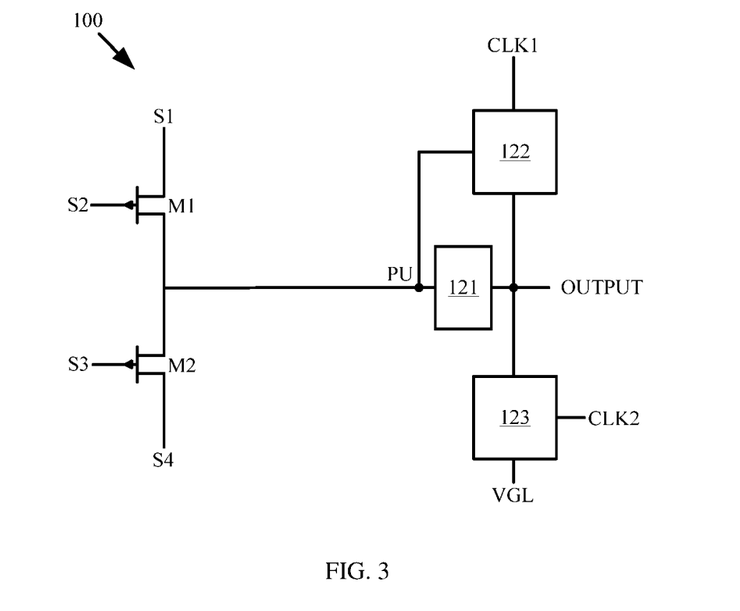
FIG. 3 is a third schematic diagram of the shift register provided by the embodiment of the present disclosure.

For example, as illustrated in FIG. 3, in the shift register 100 provided by the embodiment of the present disclosure, the driving circuit 120 includes a storage circuit 121 and an output circuit 122.

Figure 4:
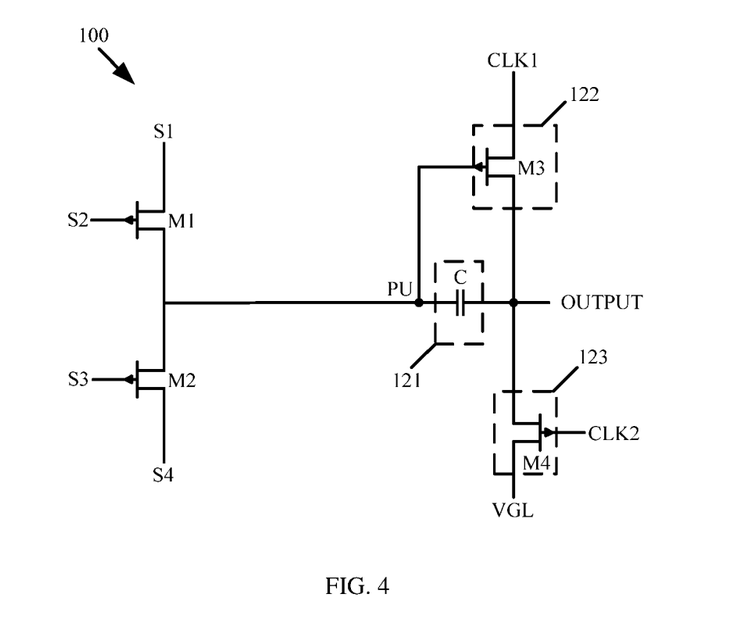
FIG. 4 is a fourth schematic diagram of the shift register provided by the embodiment of the present disclosure.

For example, as illustrated in FIG. 4, in the shift register 100 provided by the embodiment of the present disclosure, the storage circuit 121 includes a storage capacitor C, a first terminal of the storage capacitor C is connected with the pull-up node PU, and a second terminal of the storage capacitor C is connected with the output terminal OUTPUT; the output circuit 122 includes a third transistor M3, a first electrode of the third transistor M3 is connected with a first clock signal terminal to receive a first clock signal CLK1, a gate electrode of the third transistor M3 is connected with the pull-up node PU, and a second electrode of the third transistor M3 is connected with the output terminal OUTPUT; and when the voltage of the pull-up node PU satisfies an output condition of the third transistor M3 (i.e., the output condition of the driving circuit 120), the output terminal OUTPUT outputs the gate driving signal.

For example, as illustrated in FIG. 3, in the shift register 100 provided by the embodiment of the present disclosure, the driving circuit 120 further includes an initialization circuit 123, which is configured to initialize the output terminal OUTPUT.

For example, as illustrated in FIG. 4, in the shift register 100 provided by the embodiment of the present disclosure, the initialization circuit 123 includes a fourth transistor M4, a first electrode of the fourth transistor M4 is connected with the output terminal OUTPUT, a gate electrode of the fourth transistor M4 is connected with a second clock signal terminal to receive a second clock signal CLK2, and a second electrode of the fourth transistor M4 is connected with a first voltage terminal to receive a first voltage VGL.

For example, the first voltage VGL is a low-level voltage (e.g., 0 V).

Figure 5:
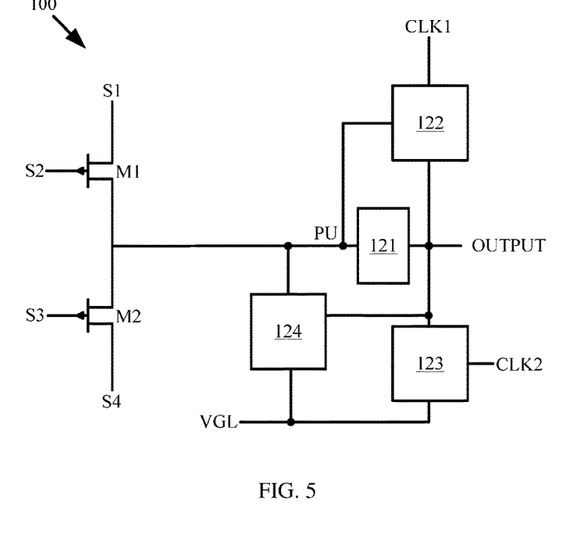
FIG. 5 is a fifth schematic diagram of the shift register provided by the embodiment of the present disclosure.

For example, as illustrated in FIG. 5, in the shift register 100 provided by the embodiment of the present disclosure, the driving circuit 120 further includes a noise reduction circuit 124, and the noise reduction circuit 124 is configured to perform noise reduction on the pull-up node PU and the output terminal OUTPUT.

Figure 6:
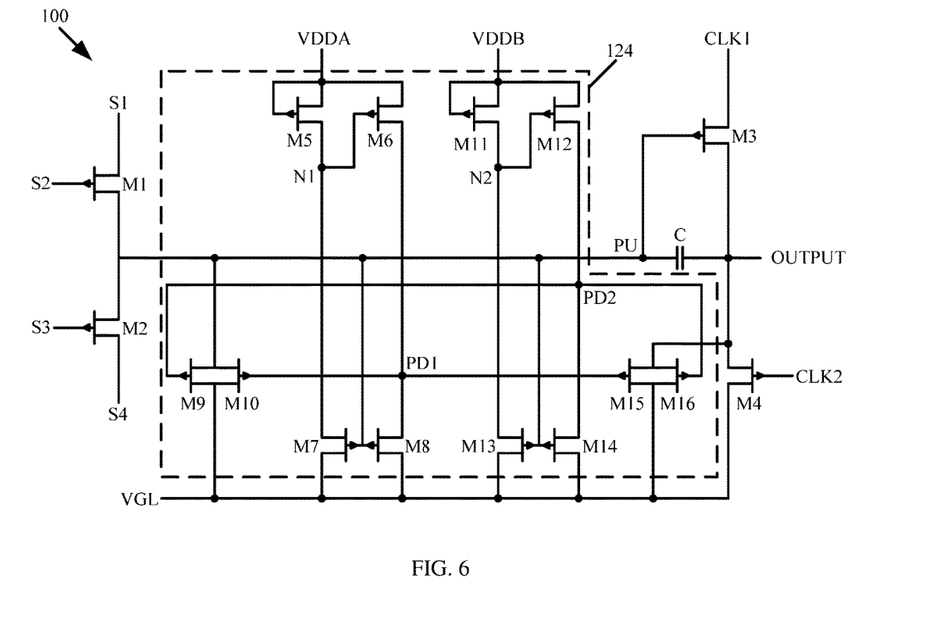
FIG. 6 is a sixth schematic diagram of the shift register provided by the embodiment of the present disclosure.

For example, as illustrated in FIG. 6, in the shift register 100 provided by the embodiment of the present disclosure, the noise reduction circuit 124 includes a fifth transistor M5, a sixth transistor M6, a seventh transistor M7, an eighth transistor M8, a ninth transistor M9, a tenth transistor M10, an eleventh transistor M11, a twelfth transistor M12, a thirteenth transistor M13, a fourteenth transistor M14, a fifteenth transistor M15 and a sixteenth transistor M16.

A first electrode of the fifth transistor M5 is connected with a first control signal terminal to receive a first control signal VDDA, a gate electrode of the fifth transistor M5 is connected with the first electrode of the fifth transistor M5, and a second electrode of the fifth transistor M5 is connected with a first node N1; a first electrode of the sixth transistor M6 is connected with the first electrode of the fifth transistor M5, a gate electrode of the sixth transistor M6 is connected with the first node N1, and a second electrode of the sixth transistor M6 is connected with a first pull-down node PD1; a first electrode of the seventh transistor M7 is connected with the first node N1, a gate electrode of the seventh transistor M7 is connected with the pull-up node PU, and a second electrode of the seventh transistor M7 is connected with a first voltage terminal to receive a first voltage VGL; a first electrode of the eighth transistor M8 is connected with the first pull-down node PD1, a gate electrode of the eighth transistor M8 is connected with the pull-up node PU, and a second electrode of the eighth transistor M8 is connected with the first voltage terminal to receive the first voltage VGL; a first electrode of the ninth transistor M9 is connected with the pull-up node PU, a gate electrode of the ninth transistor M9 is connected with a second pull-down node PD2, and a second electrode of the ninth transistor M9 is connected with the first voltage terminal to receive a first voltage VGL; a first electrode of the tenth transistor M10 is connected with the pull-up node PU, a gate electrode of the tenth transistor M10 is connected with the first pull-down node PD1, and a second electrode of the tenth transistor M10 is connected with the first voltage terminal to receive the first voltage VGL; a first electrode of the eleventh transistor M11 is connected with a second control signal terminal to receive a second control signal VDDB, a gate electrode of the eleventh transistor M11 is connected with the first electrode of the eleventh transistor M11, and a second electrode of the eleventh transistor M11 is connected with a second node N2; a first electrode of the twelfth transistor M12 is connected with the first electrode of the eleventh transistor M11, a gate electrode of the twelfth transistor M12 is connected with the second node N2, and a second electrode of the twelfth transistor M12 is connected with the second pull-down node PD2; a first electrode of the thirteenth transistor M13 is connected with the second node N2, a gate electrode of the thirteenth transistor M13 is connected with the pull-up node PU, and a second electrode of the thirteenth transistor M13 is connected with the first voltage terminal to receive the first voltage VGL; a first electrode of the fourteenth transistor M14 is connected with the second pull-down node PD2, a gate electrode of the fourteenth transistor M14 is connected with the pull-up node PU, and a second electrode of the fourteenth transistor M14 is connected with the first voltage terminal to receive the first voltage VGL; a first electrode of the fifteenth transistor M15 is connected with the output terminal OUTPUT, a gate electrode of the fifteenth transistor M15 is connected with the first pull-down node PD1, and a second electrode of the fifteenth transistor M15 is connected with the first voltage terminal to receive the first voltage VGL; a first electrode of the sixteenth transistor M16 is connected with the output terminal OUTPUT, a gate electrode of the sixteenth transistor M16 is connected with the second pull-down node PD2, and a second electrode of the sixteenth transistor M16 is connected with the first voltage terminal to receive the first voltage VGL.

Figure 7:
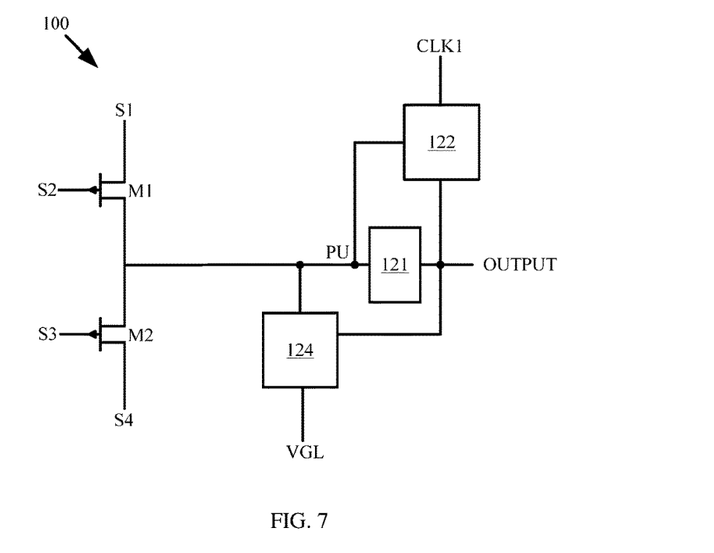
FIG. 7 is a seventh schematic diagram of the shift register provided by the embodiment of the present disclosure.

For example, as illustrated in FIG. 7, in the shift register 100 provided by the embodiment of the present disclosure, the driving circuit 120 may include the storage circuit 121, the output circuit 122 and the noise reduction circuit 124, but not include the initialization circuit 123. In this case, the noise reduction circuit 124 is configured to perform noise reduction on the pull-up node PU and the output terminal OUTPUT. The noise reduction circuit 124 may further be configured to initialize the output terminal OUTPUT.

For example, the driving circuit 120 provided by the embodiment of the present disclosure includes, but is not limited to, the arrangement mode according to the embodiment of the present disclosure, any other driving circuit 120 that is compatible with the input-reset circuit 110 may also be used in the shift register 100 provided by the embodiment of the present disclosure, and these implementation modes are also within the protection scope of the present disclosure.

Figure 8:
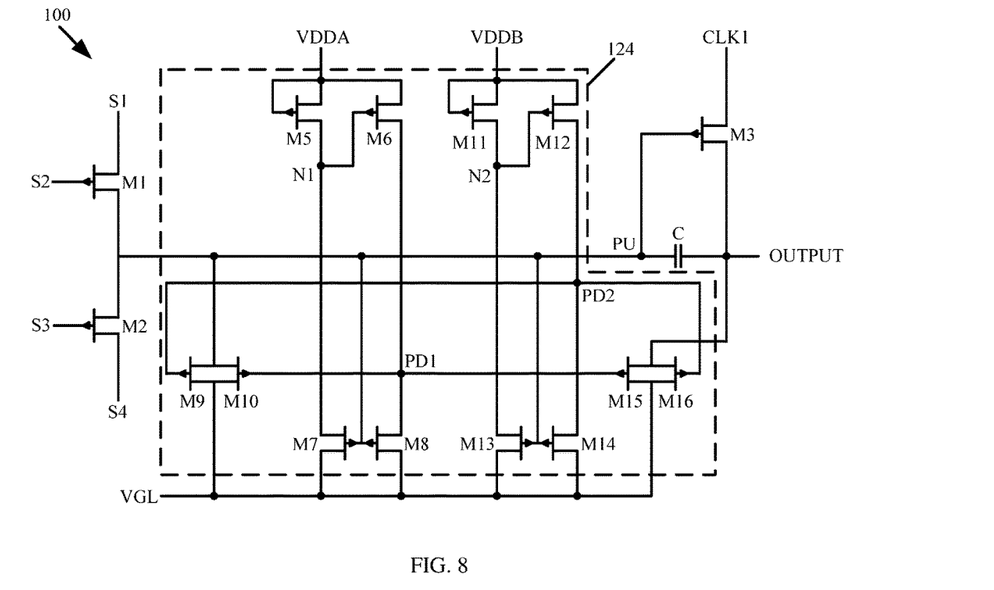
FIG. 8 is an eighth schematic diagram of the shift register provided by the embodiment of the present disclosure.

For example, the shift register shown in FIG. 8 is one implementation example of the shift register shown in FIG. 7. The first electrode of the first transistor M1 is connected with the first signal terminal to receive the first signal S1, the gate electrode of the first transistor M1 is connected with the second signal terminal to receive the second signal S2, the second electrode of the first transistor M1 is connected with the pull-up node PU; the first electrode of the second transistor M2 is connected with the fourth signal terminal to receive the fourth signal S4, the gate electrode of the second transistor M2 is connected with the third signal terminal to receive the third signal S3, and the second electrode of the second transistor M2 is connected with the pull-up node PU; the first terminal of the storage capacitor C is connected with the pull-up node PU, and the second terminal of the storage capacitor C is connected with the output terminal OUTPUT; the first electrode of the third transistor M3 is connected with the first clock signal terminal to receive the first clock signal CLK1, the gate electrode of the third transistor M3 is connected with the pull-up node PU, and the second terminal of the third transistor M3 is connected with the output terminal OUTPUT; the first electrode of the fifth transistor M5 is connected with the first control signal terminal to receive the first control signal VDDA, the gate electrode of the fifth transistor M5 is connected with the first electrode of the fifth transistor M5, and the second electrode of the fifth transistor M5 is connected with the first node N1; the first electrode of the sixth transistor M6 is connected with the first electrode of the fifth transistor M5, the gate electrode of the sixth transistor M6 is connected with the first node N1, and the second electrode of the sixth transistor M6 is connected with the first pull-down node PD1; the first electrode of the seventh transistor M7 is connected with the first node N1, the gate electrode of the seventh transistor M7 is connected with the pull-up node PU, and the second electrode of the seventh transistor M7 is connected with the first voltage terminal to receive the first voltage VGL; the first electrode of the eighth transistor M8 is connected with the first pull-down node PD1, the gate electrode of the eighth transistor M8 is connected with the pull-up node PU, and the second electrode of the eighth transistor M8 is connected with the first voltage terminal to receive the first voltage VGL; the first electrode of the ninth transistor M9 is connected with the pull-up node PU, the gate electrode of the ninth transistor M9 is connected with the second pull-down node PD2, and the second electrode of the ninth transistor M9 is connected with the first voltage terminal to receive the first voltage VGL; the first electrode of the tenth transistor M10 is connected with the pull-up node PU, the gate electrode of the tenth transistor M10 is connected with the first pull-down node PD1, and the second electrode of the tenth transistor M10 is connected with the first voltage terminal to receive the first voltage VGL; the first electrode of the eleventh transistor M11 is connected with the second control signal terminal to receive the second control signal VDDB, the gate electrode of the eleventh transistor M11 is connected with the first electrode of the eleventh transistor M11, and the second electrode of the eleventh transistor M11 is connected with the second node N2; the first electrode of the twelfth transistor M12 is connected with the first electrode of the eleventh transistor M11, the gate electrode of the twelfth transistor M12 is connected with the second node N2, and the second electrode of the twelfth transistor M12 is connected with the second pull-down node PD2; the first electrode of the thirteenth transistor M13 is connected with the second node N2, the gate electrode of the thirteenth transistor M13 is connected with the pull-up node PU, and the second electrode of the thirteenth transistor M13 is connected with the first voltage terminal to receive the first voltage VGL; the first electrode of the fourteenth transistor M14 is connected with the second pull-down node PD2, the gate electrode of the fourteenth transistor M14 is connected with the pull-up node PU, and the second electrode of the fourteenth transistor M14 is connected with the first voltage terminal to receive the first voltage VGL; the first electrode of the fifteenth transistor M15 is connected with the output terminal OUTPUT, the gate electrode of the fifteenth transistor M15 is connected with the first pull-down node PD1, and the second electrode of the fifteenth transistor M15 is connected with the first voltage terminal to receive the first voltage VGL; the first electrode of the sixteenth transistor M16 is connected with the output terminal OUTPUT, the gate electrode of the sixteenth transistor M16 is connected with the second pull-down node PD2, and the second electrode of the sixteenth transistor M16 is connected with the first voltage terminal to receive the first voltage VGL.

It should be noted that, all the transistors used in the embodiment of the present disclosure may be thin film transistors or field effect transistors or other switching devices having a same characteristic. A source electrode and a drain electrode of the transistor used here may be symmetrical in a structure, so there may be no difference between the source electrode and the drain electrode in structure. In the embodiment of the present disclosure, in order to distinguish the two electrodes other than the gate electrode of the transistor, one electrode therein is directly described as the first electrode, and the other is the second electrode, so the first electrode and the second electrode of all or part of the transistors in the embodiment of the present disclosure are interchangeable according to needs. For example, the first electrode of the transistor as described in the embodiment of the present disclosure may be the source electrode, and the second electrode may be the drain electrode; or the first electrode of the transistor is the drain electrode, and the second electrode is source electrode. In addition, the transistor may be divided into an N-type transistor and a P-type transistor according to the characteristic of the transistor. When the transistor is the P-type transistor, an on voltage is a low-level voltage (e.g., 0 V), an off voltage is a high-level voltage (e.g., 5V); when the transistor is the N-type transistor, the on voltage is a high-level voltage (e.g., 5V), and the off voltage is a low-level voltage (e.g., 0 V). The embodiment of the present disclosure is illustrated with a case where the first transistor M1, the second transistor M2, the third transistor M3, the fourth transistor M4, the fifth transistor M5, the sixth transistor M6, the seventh transistor M7, the eighth transistor M8, the ninth transistor M9, the tenth transistor M10, the eleventh transistor M11, the twelfth transistor M12, the thirteenth transistor M13, the fourteenth transistor M14, the fifteenth transistor M15 and the sixteenth transistor M16 are all N-type transistors as an example. Based on description and teachings of the implementation mode in the present disclosure, those skilled in the art can easily conceive of the implementation mode in which the N-type transistor or a combination of the N-type transistor and the P-type transistor are used according to the embodiment of the present disclosure, without any inventive work, which should be within the protection scope of the present disclosure.

Figure 11:
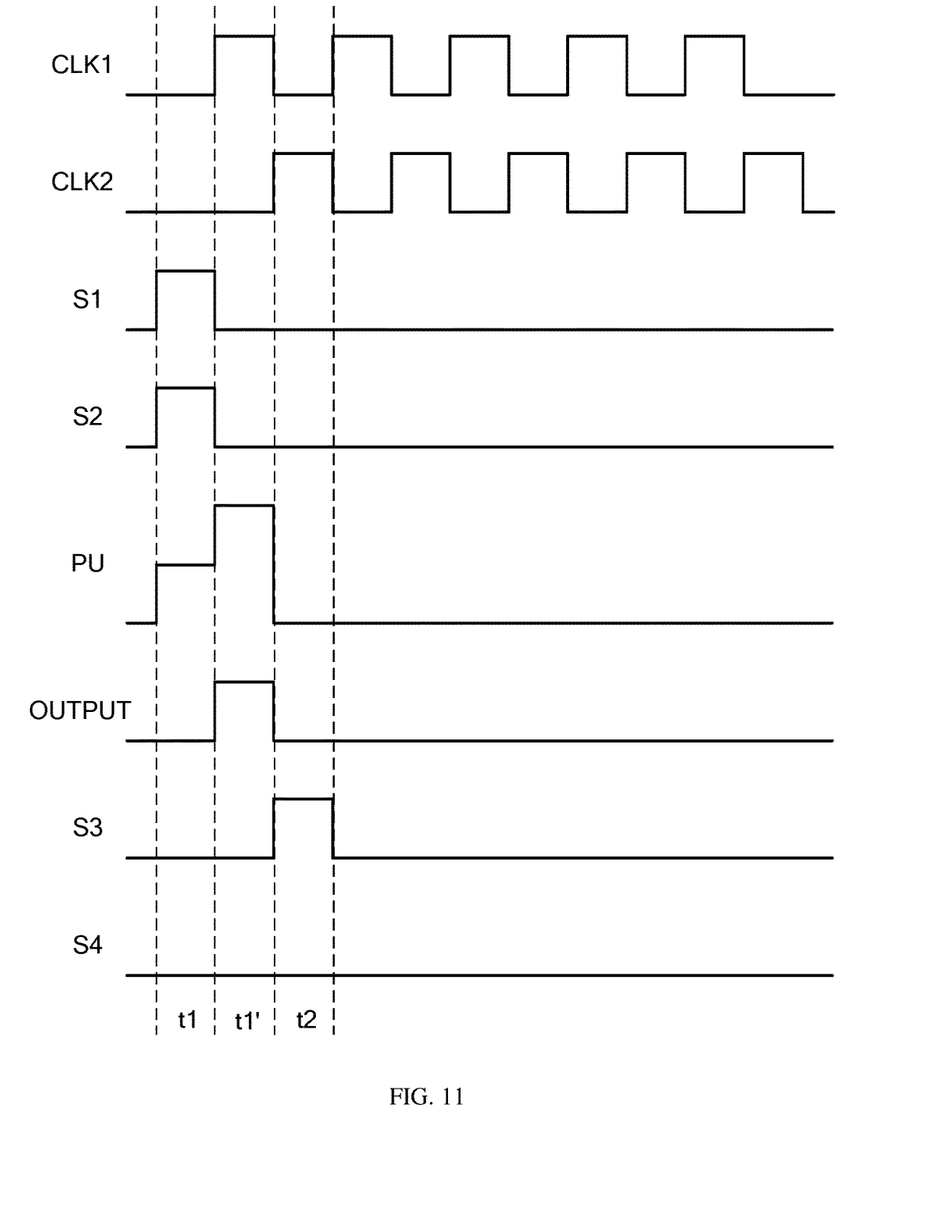
FIG. 11 is a signal waveform schematic diagram of a gate driver when performing forward scanning provided by an embodiment of the present disclosure.
Figure 12:
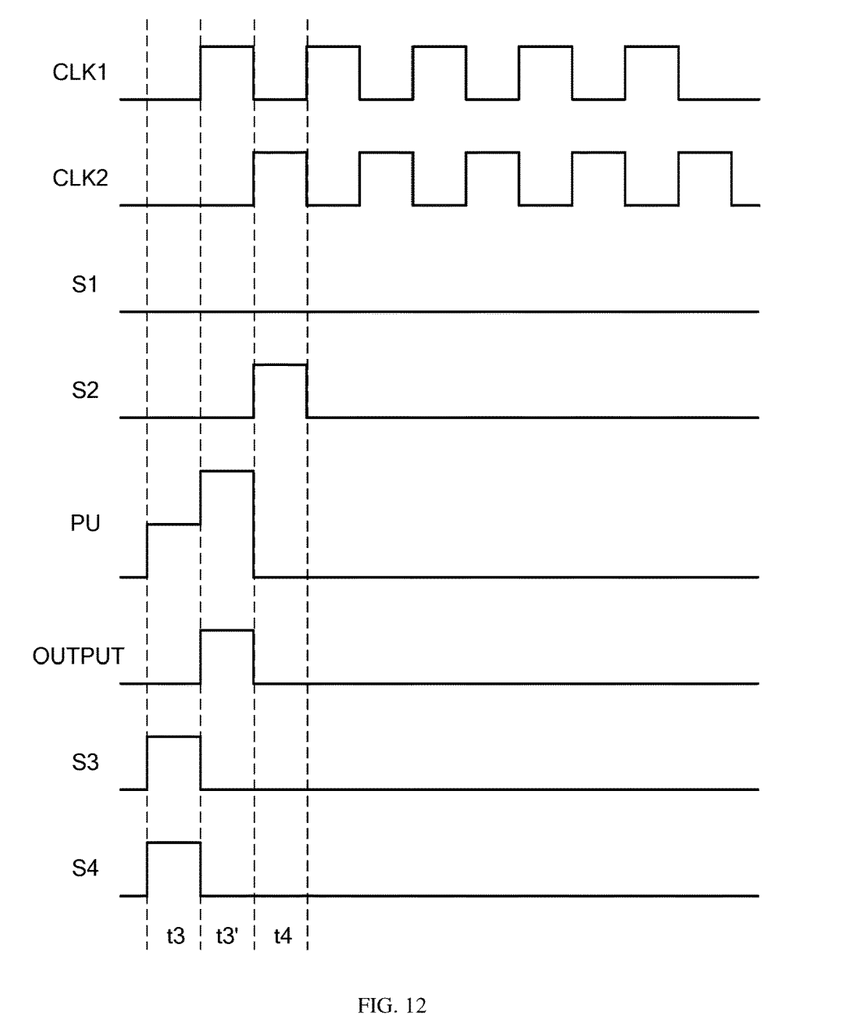
FIG. 12 is a signal waveform schematic diagram of a gate driver when performing reverse scanning provided by an embodiment of the present disclosure.

For example, in the shift register 100 provided by the embodiment of the present disclosure, in the input phase of forward scanning, a voltage of the first signal S1 is a high-level voltage, a voltage of the second signal S2 is a high-level voltage, a voltage of the third signal S3 is a low-level voltage, and a voltage of the fourth signal S4 is a low-level voltage; in the reset phase of forward scanning, the voltage of the first signal S1 is a low-level voltage, the voltage of the second signal S2 is a low-level voltage, the voltage of the third signal S3 is a high-level voltage, and the voltage of the fourth signal S4 is a low-level voltage; in the input phase of reverse scanning, the voltage of the first signal S1 is a low-level voltage, the voltage of the second signal S2 is a low-level voltage, the voltage of the third signal S3 is a high-level voltage, and the voltage of the fourth signal S4 is a high-level voltage; and in the reset phase of reverse scanning, the voltage of the first signal S1 is a low-level voltage, the voltage of the second signal S2 is a high-level voltage, the voltage of the third signal S3 is a low-level voltage, and the voltage of the fourth signal S4 is a low-level voltage. In FIG. 11 and FIG. 12 below, an operation principle of the shift register 100 will be described in detail in combination with waveform diagrams of the respective signals.

Figure 9:
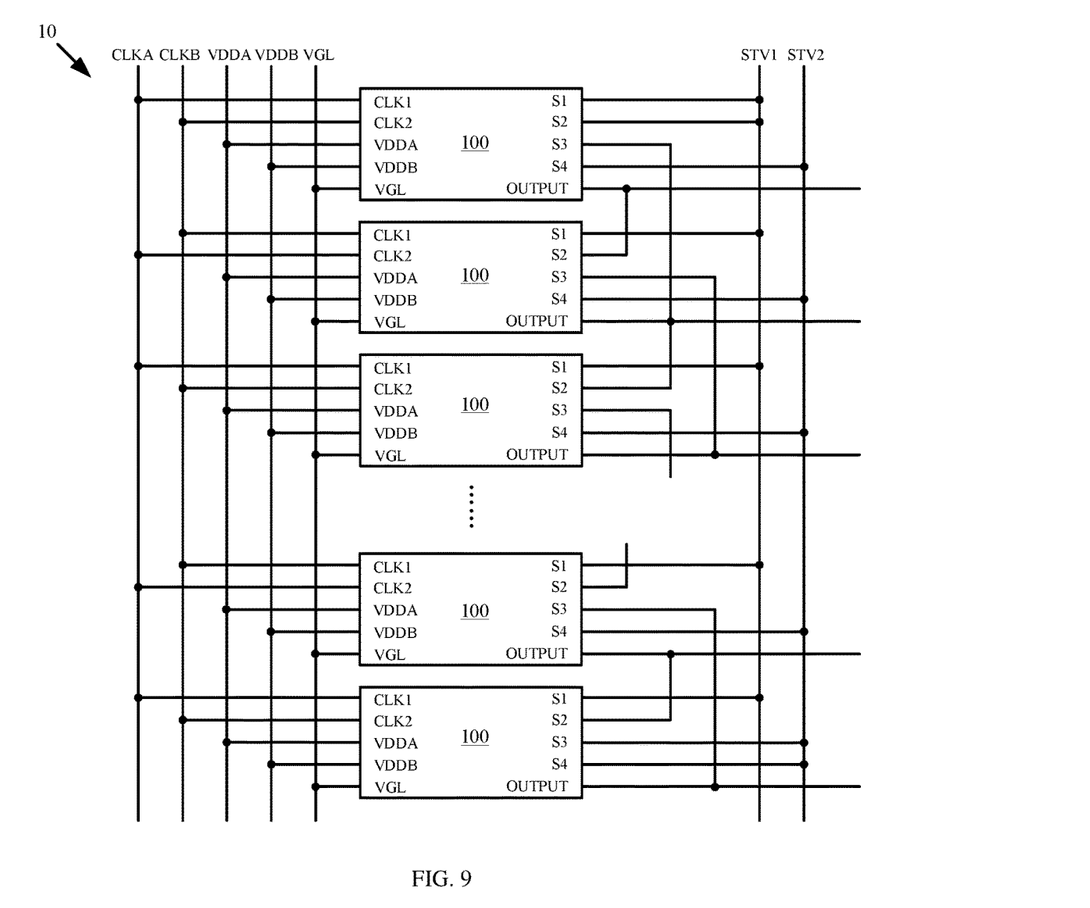
FIG. 9 is a schematic diagram of a gate driver provided by an embodiment of the present disclosure.

An embodiment of the present disclosure further provides a gate driver 10, and as illustrated in FIG. 9, the gate driver 10 comprises the shift register 100 provided by any one of the embodiments of the present disclosure.

For example, as illustrated in FIG. 9, the gate driver 10 provided by the embodiment of the present disclosure, comprises a plurality of cascaded shift registers 100, except the first-stage shift register 100 and the last-stage shift register 100, a second signal S2 of a present-stage shift register 100 is an output signal output by the output terminal OUTPUT of a previous-stage shift register 100, and a third signal S3 of the present-stage shift register 100 is an output signal output by the output terminal OUTPUT of a next-stage shift register 100.

It should be noted that, because the gate driver 10 provided by the embodiment of the present disclosure can implement forward scanning and reverse scanning, when a scanning direction is switched, the "previous stage" and the "next stage" in terms of timing are switched correspondingly, the "previous stage" and the "next stage" as described above do not refer to the previous stage and the next stage in terms of scan timing, but refer to the previous stage and the next stage in terms of physical connection.

For example, the gate driver 10 shown in FIG. 9 is formed by cascading the shift registers as illustrated in FIG. 6 as an example, and the first clock CLKA and the second clock CLKB are respectively used for providing clock signals which are mutually reversed to each other. That is to say, when the signal of the first clock CLKA is a high-level voltage, the signal of the second clock CLKB is a low-level voltage; when the signal of the first clock CLKA is a low-level voltage, the signal of the second clock CLKB is a high-level voltage. For example, in FIG. 9, a first clock signal CLK1 of shift registers 100 of an odd-numbered row is the signal of the first clock CLKA, a second clock signal CLK2 is the signal of the second clock CLKB; and a first clock signal CLK1 of the shift registers 100 of an even-numbered row is the signal of the second clock CLKA, the second clock signal CLK2 is the signal of the first clock CLKB. For example, a first trigger signal STV1 and a second trigger signal STV2 are used for all or part of signals in the first signal S1, the second signal S2, the third signal S3 and the fourth signal S4 of the shift registers 100, so that respective stages of shift registers 100 in the gate driver 10 can satisfy the timing requirements for forward scanning or reverse scanning. For example, by changing the timing and waveforms of the first trigger signal STV1 and the second trigger signal STV2, the first signal S1, the second signal S2, the third signal S3 and the fourth signal S4 can satisfy implementation conditions of forward scanning or reverse scanning (a forward scanning timing chart is shown in FIG. 11 or a reverse scanning timing chart is shown in FIG. 12), which can implement switch between forward scanning and reverse scanning. For example, during forward scanning, the first trigger signal STV1 provides the first signal S1 with the shift registers and is the high-level voltage, the second trigger signal STV2 provides the fourth signal S4 with the shift registers and is the low-level voltage; during reverse scanning, the first trigger signal STV1 provides the first signal S1 with the shift registers and is the low-level voltage, and the second trigger signal STV2 provides the fourth signal S4 with the shift registers and is the high-level voltage. For example, during forward scanning, the first trigger signal STV1 provides the second signal S2 with the first-stage shift register and is the high-level voltage; during reverse scanning, the second trigger signal STV2 provides the third signal S3 with the last-stage shift register and is the high-level voltage.

For example, the first clock CLKA, the second clock CLKB, the first control signal VDDA, the second control signal VDDB, the first voltage VGL, the first trigger signal STV1 and the second trigger signal STV2 may all be implemented by means of a chip having a signal outputting function or a programmable logic circuit.

For example, the gate driver 10 provided by the embodiment of the present disclosure includes, but is not limited to, the case as shown in FIG. 9, and with respect to different shift registers 100, there may be different cascading modes, for example, 4 clocks (or more clocks) may be provided for providing clock signals, or more trigger signal terminals may be provided for providing trigger signals.

Figure 10:
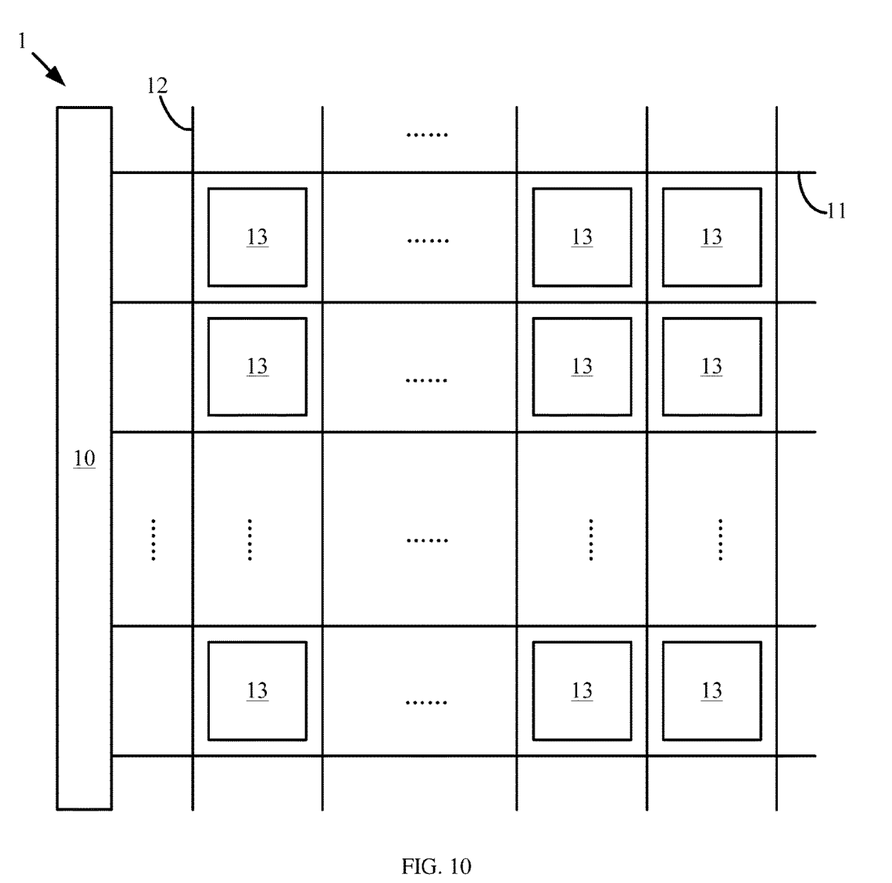
FIG. 10 is a schematic diagram of a display panel provided by an embodiment of the present disclosure.

An embodiment of the present disclosure further provides a display panel 1, and as illustrated in FIG. 10, and the display panel 1 comprises the gate driver 10 provided by any one of the embodiments of the present disclosure.

For example, the display panel 1 provided by the embodiment of the present disclosure, as illustrated in FIG. 10, further comprises gate lines 11, data lines 12, and a plurality of pixel units 13 defined by the gate lines 11 and the data lines 12 intersecting with each other, and the gate driver 10 is configured to provide gate driving signals to the gate lines 11. For example, the plurality of pixel units 13 can display an image when driven by signals provided by the gate lines 11 and the data lines 12.

For example, the display panel provided by the embodiment of the present disclosure may be used in any product or component having a display function, such as a mobile phone, a tablet computer, a television, a monitor, a laptop computer, a digital photo frame, a navigator, etc.

For example, operation procedures of the shift register and the gate driver are described with reference to the shift register illustrated in FIG. 6, the gate driver illustrated in FIG. 9, and the signal waveforms illustrated in FIG. 11 and FIG. 12.

Figure 13:
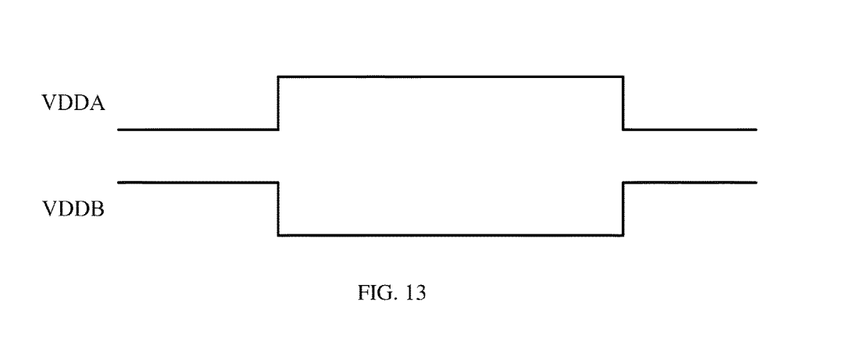
FIG. 13 is a waveform schematic diagram of a first control signal and a second control signal of a gate driver provided by an embodiment of the present disclosure.

For example, as illustrated in FIG. 6 and FIG. 11, during forward scanning, in the input phase t1 of forward scanning, the first transistor M1 is an input transistor, the second transistor M2 is a discharge transistor, and the voltage of the first signal S1 is a high-level voltage, the voltage of the second signal S2 is a high-level voltage, the voltage of the third signal S3 is a low-level voltage, and the voltage of the fourth signal S4 is a low-level voltage. The first transistor M1 is turned on, the voltage (i.e., the high-level voltage) of the first signal S1 is written into the pull-up node PU (for example, at this time, the pull-up node PU is boosted to a first high-level voltage), and the second transistor M2 is turned off. For example, as illustrated in FIG. 13, the first control signal VDDA and the second control signal VDDB are a pair of reverse signals, that is to say, when the first control signal VDDA is a high-level voltage, the second control signal VDDB is a low-level voltage; when the first control signal VDDA is a low-level voltage, the second control signal VDDB is a high-level voltage. For example, time periods of the first control signal VDDA and the second control signal VDDB are in a second order (e.g., one second, two seconds, etc.). For example, the first control signal VDDA and the second control signal VDDB are respectively used for controlling on and off of the first pull-down node PD1 and the second pull-down node PD2, to further control noise reduction and discharging performed on the pull-up node PU and the output terminal OUTPUT. For example, it is illustrated with a case where the VDDA is a high level, and the VDDB is a low level as an example; the fifth transistor M5 and the ninth transistor M9 are turned on to perform charging on the first pull-down node PD1; however, because the pull-up node PU is charged to the high level at this time, the seventh transistor M7 and the eighth transistor M8 are turned on, and the first pull-down node PD1 is pulled down to the low level. In the t1' stage, the first clock signal CLK1 is at a high level; due to the bootstrap effect of the storage capacitor C, the pull-up node PU is boosted again (for example, the pull-up node PU is boosted to a second high-level voltage, the second high-level voltage is greater than the first high-level voltage), the third transistor M3 is turned on, and the first clock signal CLK1 is output as a gate driving signal to the output terminal OUTPUT through the third transistor M3. That is to say, an output condition of the driving circuit 120 is such that the pull-up node PU is boosted again (i.e., the pull-up node PU is boosted to the second high-level voltage), and the third transistor M3 is turned on. With reference to FIG. 9, the gate driving signal output by the output terminal OUTPUT of the present-stage shift register is simultaneously connected with a second signal terminal of the next-stage shift register as the second signal S2 of the next-stage shift register, that is to say, a gate driving signal output by an output terminal OUTPUT of each stage of shift register is used for triggering a next stage of shift register, so that stage-by-stage forward scanning and outputting of the gate driving signal can be implemented. In a reset phase t2 of forward scanning, the voltage of the first signal S1 is the low-level voltage, the voltage of the second signal S2 is the low-level voltage, the voltage of the third signal S3 is the high-level voltage, and the voltage of the fourth signal S4 is the low-level voltage, the first transistor M1 is turned off, the second transistor M2 is turned on, and the voltage of the fourth signal S4 (i.e., the low-level voltage) is written into the pull-up node PU (i.e., to perform resetting or discharging on the pull-up node PU). At this time, because the pull-up node PU is at the low level, the seventh transistor M7 and the eighth transistor M8 are turned off, the first pull-down node PD1 is charged to a high level, the tenth transistor M10 is turned on, to also perform resetting or discharging on the pull-up node PU, and the fifteenth transistor M15 is turned on, to perform resetting or discharging on the output terminal OUTPUT. At a same time, in the reset phase t2 of forward scanning, because the second clock signal CLK2 is at a high level, the fourth transistor M4 is turned on, to also perform initializing or discharging on the output terminal OUTPUT.

For example, as illustrated in FIG. 6 and FIG. 12, during reverse scanning, in an input phase t3 of reverse scanning, the second transistor M2 is an input transistor, the first transistor M1 is a discharge transistor, the voltage of the first signal S1 is a low-level voltage, the voltage of the second signal S2 is a low-level voltage, the voltage of the third signal S3 is a high-level voltage, and the voltage of the fourth signal S4 is a high-level voltage. The second transistor M2 is turned on, to write the voltage of the fourth signal S4 (i.e., the high-level voltage) into the pull-up node PU (for example, at this time, the pull-up node PU is boosted to the first high-level voltage, and the transistor M1 is turned off. For example, similar to a case during forward scanning, as illustrated in FIG. 13, the first control signal VDDA and the second control signal VDDB are a pair of reverse signals, that is to say, when the first control signal VDDA is a high-level voltage, the second control signal VDDB is a low-level voltage; when the first control signal VDDA is a low-level voltage, and the second control signal VDDB is a high-level voltage. For example, time periods of the first control signal VDDA and the second control signal VDDB are in a second order (e.g., one second, two seconds, etc.). For example, the first control signal VDDA and the second control signal VDDB are respectively used for controlling on and off of the first pull-down node PD1 and the second pull-down node PD2, to further control noise reduction and discharging performed on the pull-up node PU and the output terminal OUTPUT. For example, it is illustrated with a case where the VDDA is a high level, and the VDDB is a low level as an example; the fifth transistor M5 and the ninth transistor M9 are turned on, to perform charging on the first pull-down node PD1; however, because the pull-up node PU is charged at this time to the high level, the seventh transistor M7 and the eighth transistor M8 are turned on, and the first pull-down node PD1 is pulled down to the low level. In the t3' stage, the first clock signal CLK1 is a high level, due to a bootstrap effect of the storage capacitor C, the pull-up node PU is boosted again (for example, the pull-up node PU is boosted to a second high-level voltage), the third transistor M3 is turned on, and the first clock signal CLK1 is output as a gate driving signal to the output terminal OUTPUT through the third transistor M3. That is to say, the output condition of the driving circuit 120 is such that the pull-up node PU is boosted again (i.e., the pull-up node PU is boosted to the second high-level voltage), and the third transistor M3 is turned on. With reference to FIG. 9, the gate driving signal output by the output terminal OUTPUT of the present-stage shift register is simultaneously connected with a third signal terminal of the previous-stage shift register as the third signal S3 of the previous-stage shift register, that is to say, a gate driving signal output by an output terminal OUTPUT of each stage of shift register is used for triggering a previous stage of shift register, so that stage-by-stage reverse scanning and outputting of the gate driving signal can be implemented. In a reset phase t4 of reverse scanning, the voltage of the first signal S1 is a low-level voltage, the voltage of the second signal S2 is a high-level voltage, the voltage of the third signal S3 is a low-level voltage, and the voltage of the fourth signal S4 is a low-level voltage, after the first transistor M1 is turned on, the second transistor M2 is turned off, to write the voltage of the first signal S1 (i.e., the low-level voltage) into the pull-up node PU (i.e., to perform resetting or discharging on the pull-up node PU). At this time, because the pull-up node PU is at a low level, the seventh transistor M7 and the eighth transistor M8 are turned off, the first pull-down node PD1 is charged to a high level, the tenth transistor M10 is turned on, to also perform resetting or discharging on the pull-up node PU, and the fifteenth transistor M15 is turned on, to perform initializing or discharging on the output terminal OUTPUT. At a same time, in the reset phase t4 of reverse scanning, because the second clock signal CLK2 is at a high level, the fourth transistor M4 is turned on to also perform initializing or discharging on the output terminal OUTPUT.

For example, when the first control signal VDDA is a low-level voltage and the second control signal VDDB is a high-level voltage, the eleventh transistor M11 and the twelfth transistor M12 are turned on, to perform charging on the second pull-down node PD2; when the pull-up node PU is charged to a high-level, the thirteenth transistor M13 and the fourteenth transistor M14 are turned on, and the second pull-down node PD2 is pulled down to a low level. When the pull-up node PU is at a low level, the thirteenth transistor M13 and the fourteenth transistor M14 are turned off, the second pull-down node PD2 is charged to a high level, the ninth transistor M9 is turned on, to also perform charging on the pull-up node PU, and the sixteenth transistor M15 is turned on, to perform initializing or discharging on the output terminal OUTPUT.

Figure 14:
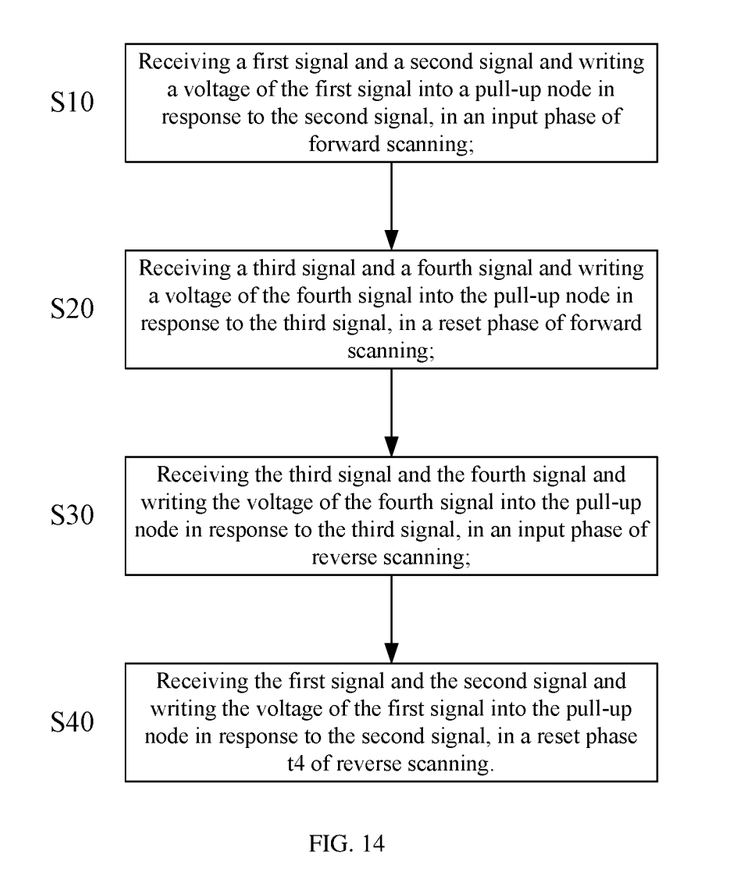
FIG. 14 is a flow chart of a bidirectional scanning driving method provided by an embodiment of the present disclosure.

An embodiment of the present disclosure further provides a bidirectional scanning driving method of the gate driver 10 provided by any one of the embodiments of the present disclosure, and as illustrated in FIG. 14, the driving method comprises the following steps.

Step S10: receiving a first signal S1 and a second signal S2 and writing a voltage of the first signal S1 into a pull-up node PU in response to the second signal S2, in an input phase t1 of forward scanning;

Step S20: receiving a third signal S3 and a fourth signal S4 and writing a voltage of the fourth signal S4 into the pull-up node PU in response to the third signal S3, in a reset phase t2 of forward scanning;

Step S30: receiving the third signal S3 and the fourth signal S4 and writing the voltage of the fourth signal S4 into the pull-up node PU in response to the third signal S3, in an input phase t3 of reverse scanning;

Step S40: receiving the first signal S1 and the second signal S2 and writing the voltage of the first signal S1 into the pull-up node PU in response to the second signal S2, in a reset phase t4 of reverse scanning.

For example, the method provided by the embodiment of the present disclosure further comprises outputting a gate driving signal, when the voltage of the pull-up node PU satisfies an output condition of the driving circuit 120.

For example, in the case where both the first transistor M1 and the second transistor M2 are N-type transistors, in the input phase of forward scanning, the voltage of the first signal S1 is a high-level voltage, the voltage of the second signal S2 is a high-level voltage, the voltage of the third signal S3 is a low-level voltage, the voltage of the fourth signal S4 is a low-level voltage; in the reset phase of forward scanning, the voltage of the first signal S1 is a low-level voltage, the voltage of the second signal S2 is a low-level voltage, the voltage of the third signal S3 is a high-level voltage, the voltage of the fourth signal S4 is a low-level voltage; in the input phase of reverse scanning, the voltage of the first signal S1 is a low-level voltage, the voltage of the second signal S2 is a low-level voltage, the voltage of the third signal S3 is a high-level voltage, the voltage of the fourth signal S4 is a high-level voltage; and in the reset phase of reverse scanning, the voltage of the first signal S1 is a low-level voltage, the voltage of the second signal S2 is a high-level voltage, the voltage of the third signal S3 is a low-level voltage, and the voltage of the fourth signal S4 is a low-level voltage.

A shift register, a gate driver, a display panel and a driving method provided by embodiments of the present disclosure may implement bidirectional scanning of the gate driver, and improve compatibility of the display panel.

Although detailed description has been given above to the present disclosure with reference to general description and preferred embodiment, it is apparent to those skilled in the art that some modifications or improvements may be made on the basis of the embodiments of the present disclosure. Therefore, the modifications or improvements made without departing from the spirit of the present disclosure shall all fall within the scope of protection of the present disclosure.

The application claims priority to the Chinese patent application No. 201610928535.4, filed Oct. 31, 2016, the entire disclosure of which is incorporated herein by reference as part of the present application.

What is claimed is:

1. A shift register, comprising:
an input-reset circuit, connected with a pull-up node; and
a driving circuit, connected with the pull-up node,
wherein the input-reset circuit is configured to:
  receive a first signal and a second signal and write a voltage of the first signal into the pull-up node in response to the second signal, in an input phase of forward scanning;
  receive a third signal and a fourth signal and write a voltage of the fourth signal into the pull-up node in response to the third signal, in a reset phase of forward scanning;
  receive the third signal and the fourth signal and write the voltage of the fourth signal into the pull-up node in response to the third signal, in an input phase of reverse scanning; and
  receive the first signal and the second signal and write the voltage of the first signal into the pull-up node in response to the second signal, in a reset phase of reverse scanning,
wherein the driving circuit is configured to output a gate driving signal when a voltage of the pull-up node satisfies an output condition of the driving circuit, and wherein
in the input phase of forward scanning, a voltage of the first signal is a high-level voltage, a voltage of the second signal is a high-level voltage, a voltage of the third signal is a low-level voltage, and a voltage of the fourth signal is a low-level voltage;
in the reset phase of forward scanning, the voltage of the first signal is a low-level voltage, the voltage of the second signal is a low-level voltage, the voltage of the third signal is a high-level voltage, and the voltage of the fourth signal is a low-level voltage;
in the input phase of reverse scanning, the voltage of the first signal is a low-level voltage, the voltage of the second signal is a low-level voltage, the voltage of the third signal is a high-level voltage, and the voltage of the fourth signal is a high-level voltage; and
in the reset phase of reverse scanning, the voltage of the first signal is a low-level voltage, the voltage of the second signal is a high-level voltage, the voltage of the third signal is a low-level voltage, and the voltage of the fourth signal is a low-level voltage.

2. The shift register according to claim 1, wherein the input-reset circuit includes a first transistor and a second transistor,
a first electrode of the first transistor is connected with a first signal terminal to receive the first signal, a gate electrode of the first transistor is connected with a second signal terminal to receive the second signal, a second electrode of the first transistor is connected with the pull-up node; and
a first electrode of the second transistor is connected with a fourth signal terminal to receive the fourth signal, a gate electrode of the second transistor is connected with a third signal terminal to receive the third signal, and a second electrode of the second transistor is connected with the pull-up node.

3. The shift register according to claim 1, wherein the driving circuit includes a storage circuit and an output circuit.

4. The shift register according to claim 3, wherein,
the storage circuit includes a storage capacitor, a first terminal of the storage capacitor is connected with the pull-up node, and a second terminal of the storage capacitor is connected with an output terminal; and
the output circuit includes a third transistor, a first electrode of the third transistor is connected with a first clock signal terminal to receive a first clock signal, a gate electrode of the third transistor is connected with the pull-up node, and a second electrode of the third transistor is connected with the output terminal.

5. The shift register according to claim 4, wherein the driving circuit further includes an initialization circuit, which is configured to initialize the output terminal.

6. The shift register according to claim 5, wherein the initialization circuit includes a fourth transistor,
a first electrode of the fourth transistor is connected with the output terminal, a gate electrode of the fourth transistor is connected with a second clock signal terminal to receive a second clock signal, and a second electrode of the fourth transistor is connected with a first voltage terminal to receive a first voltage.

7. The shift register according to claim 3, wherein the driving circuit further includes a noise reduction circuit, which is configured to perform noise reduction on the pull-up node and on an output terminal.

8. The shift register according to claim 7, wherein the noise reduction circuit includes a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor and a sixteenth transistor, wherein
a first electrode of the fifth transistor is connected with a first control signal terminal to receive a first control signal, a gate electrode of the fifth transistor is connected with the first electrode of the fifth transistor, and a second electrode of the fifth transistor is connected with a first node;
a first electrode of the sixth transistor is connected with the first electrode of the fifth transistor, a gate electrode of the sixth transistor is connected with the first node, and a second electrode of the sixth transistor is connected with a first pull-down node;
a first electrode of the seventh transistor is connected with the first node, a gate electrode of the seventh transistor is connected with the pull-up node, and a second electrode of the seventh transistor is connected with a first voltage terminal;
a first electrode of the eighth transistor is connected with the first pull-down node, a gate electrode of the eighth transistor is connected with the pull-up node, and a second electrode of the eighth transistor is connected with the first voltage terminal;
a first electrode of the ninth transistor is connected with the pull-up node, a gate electrode of the ninth transistor is connected with a second pull-down node, and a second electrode of the ninth transistor is connected with the first voltage terminal;
a first electrode of the tenth transistor is connected with the pull-up node, a gate electrode of the tenth transistor is connected with the first pull-down node, and a second electrode of the tenth transistor is connected with the first voltage terminal;

a first electrode of the eleventh transistor is connected with a second control signal terminal to receive a second control signal, a gate electrode of the eleventh transistor is connected with the first electrode of the eleventh transistor, and a second electrode of the eleventh transistor is connected with a second node;

a first electrode of the twelfth transistor is connected with the first electrode of the eleventh transistor, a gate electrode of the twelfth transistor is connected with the second node, and a second electrode of the twelfth transistor is connected with the second pull-down node;

a first electrode of the thirteenth transistor is connected with the second node, a gate electrode of the thirteenth transistor is connected with the pull-up node, and a second electrode of the thirteenth transistor is connected with the first voltage terminal;

a first electrode of the fourteenth transistor is connected with the second pull-down node, a gate electrode of the fourteenth transistor is connected with the pull-up node, and a second electrode of the fourteenth transistor is connected with the first voltage terminal;

a first electrode of the fifteenth transistor is connected with the output terminal, a gate electrode of the fifteenth transistor is connected with the first pull-down node, and a second electrode of the fifteenth transistor is connected with the first voltage terminal; and a first electrode of the sixteenth transistor is connected with the output terminal, a gate electrode of the sixteenth transistor is connected with the second pull-down node, and a second electrode of the sixteenth transistor is connected with the first voltage terminal.

9. A gate driver, comprising the shift register according to claim 1.

10. A gate driver comprising a plurality of cascaded shift registers each according to claim 1,
wherein, except for a first-stage shift register and a last-stage shift register, the second signal of a present-stage shift register is an output signal output by an output terminal of a previous-stage shift register, and the third signal of the present-stage shift register is an output signal output by an output terminal of a next-stage shift register.

11. A display panel, comprising the gate driver according to claim 9.

12. The display panel according to claim 11, further comprising gate lines, data lines, and a plurality of pixel units defined by the gate lines and the data lines intersecting with each other, wherein the gate driver is configured to provide gate driving signals to the gate lines.

13. A bidirectional scanning driving method of the gate driver according to claim 9, comprising:
receiving the first signal and the second signal and writing the voltage of the first signal into the pull-up node in response to the second signal, in the input phase of forward scanning;
receiving the third signal and the fourth signal and writing the voltage of the fourth signal into the pull-up node in response to the third signal, in the reset phase of forward scanning;
receiving the third signal and the fourth signal and writing the voltage of the fourth signal into the pull-up node in response to the third signal, in the input phase of reverse scanning; and
receiving the first signal and the second signal and writing the voltage of the first signal into the pull-up node in response to the second signal, in the reset phase of reverse scanning.

14. The method according to claim 13, further comprising outputting a gate driving signal, when the voltage of the pull-up node satisfies the output condition of the driving circuit.

15. The shift register according to claim 2, wherein the driving circuit includes a storage circuit and an output circuit.

16. A display panel, comprising the gate driver according to claim 10.

17. The display panel according to claim 16, further comprising gate lines, data lines, and a plurality of pixel units defined by the gate lines and the data lines intersecting with each other, wherein the gate driver is configured to provide gate driving signals to the gate lines.

18. A bidirectional scanning driving method of the gate driver according to claim 10, comprising:
receiving the first signal and the second signal and writing the voltage of the first signal into the pull-up node in response to the second signal, in the input phase of forward scanning;
receiving the third signal and the fourth signal and writing the voltage of the fourth signal into the pull-up node in response to the third signal, in the reset phase of forward scanning;
receiving the third signal and the fourth signal and writing the voltage of the fourth signal into the pull-up node in response to the third signal, in the input phase of reverse scanning; and
receiving the first signal and the second signal and writing the voltage of the first signal into the pull-up node in response to the second signal, in the reset phase of reverse scanning.

* * * * *